United States Patent [19]
Chuang

[11] Patent Number: 5,998,259
[45] Date of Patent: Dec. 7, 1999

[54] METHOD OF FABRICATING DUAL CYLINDRICAL CAPACITOR

[75] Inventor: Shu-Ya Chuang, Hsinchu-Hsien, Taiwan

[73] Assignee: United Semiconductor Corp., Hsin-Chu, Taiwan

[21] Appl. No.: 09/066,196

[22] Filed: Apr. 24, 1998

[30] Foreign Application Priority Data

Mar. 20, 1998 [TW] Taiwan ................................. 87104162

[51] Int. Cl.[6] ............................................. H01L 21/8242
[52] U.S. Cl. ................................................... 438/253
[58] Field of Search ................................... 438/253, 239, 438/238, 186, 396, 254, 255, 397, 398

[56] References Cited

U.S. PATENT DOCUMENTS 5,940,701  8/1999  Tseng ....................... 438/253
5,940,713  8/1999  Green ....................... 438/396

Primary Examiner—Charles Bowers
Assistant Examiner—Craig Thompson
Attorney, Agent, or Firm—Christie, Parker & Hale, LLP

[57] ABSTRACT

A method of fabricating a dual cylindrical capacitor in a DRAM. A semiconductor substrate comprising a gate, a source/drain region, field oxide layer, a first oxide layer covering the whole semiconductor substrate, and a poly-via penetrating through the first oxide layer to electrically connect the source/drain region is provided. A first poly-silicon layer is formed on the first oxide layer and the poly-via. A silicon nitride layer is formed and patterned on the first poly-silicon layer and aligned with the poly-via. An oxide spacer is formed on a side wall of the silicon nitride layer, so that a part of the first poly-silicon layer is covered by the oxide spacer. A part of the first poly-silicon layer is removed with the oxide spacer and the silicon nitride layer as a mask until the first oxide layer is exposed. The silicon nitride layer is removed. A poly-silicon spacer is formed around the oxide spacer. The oxide spacer is removed, so that the remaining first poly-silicon layer and the poly-silicon spacer are combined as a bottom electrode. A dielectric layer is formed on a surface of the electrode. A top electrode is formed on the dielectric layer.

15 Claims, 6 Drawing Sheets

METHOD OF FABRICATING DUAL CYLINDRICAL CAPACITOR

CROSS-REFERENCE TO RELATED APPLICATION

This application claims priority benefit of Taiwan application Serial no. 87104162, filed Mar. 20, 1998, the full disclosure of which is incorporated herein by reference.

BACKGROUND OF THE INVENTION

1. Field of the Invention

The invention relates to a method of fabricating an dynamic random access memory (DRAM), and more particularly to a method of fabricating a capacitor with a higher capacitance in a DRAM, by increasing surface area of an electrode.

2. Description of the Related Art

As the function of a microprocessor becomes more and more powerful, the program and calculation of a software becomes more and more complicated, and thus, the required capacitance of a memory is larger and larger. FIG. 1 shows a circuit diagram of a conventional DRAM. A memory cell comprises a transfer transistor 10 and a storing capacitor 11. The source region of the transfer transistor 10 is coupled with a corresponding bit line 12, whereas the gate is coupled with a corresponding word line 13. The drain region of the transfer transistor 10 electrically connects with the storing electrode 14, that is, the bottom electrode of the capacitor 11. The plate electrode 15, that is, the top electrode or the cell electrode, connects with a constant voltage source. A dielectric layer 16 is formed between the storing electrode and the plate electrode.

The capacitor is the heart for storing input signal in a DRAM. For a large amount of charges to be stored in a capacitor, it is more frequent that an soft error is caused by noise, such as an α particle, during data access, and therefore, the refresh frequency is reduced. Several ways are available to increase the storing capacitance of a capacitor. (1) Using a dielectric layer with a higher dielectric constant, the storing charge per unit area is increased. (2) To decrease the thickness of the dielectric layer, a higher capacitance can be obtained. However, the quality of the dielectric layer restricts the thickness of the dielectric layer to a certain value. (3) By increasing the surface area of a capacitor, the amount of charges stored in a capacitor is increased. However, with increasing the surface area of a capacitor, the integration of a device is decreased.

For a conventional DRAM with a smaller amount of storing charges, a two dimensional planar type capacitor is adapted in a integrated circuit. The planar type capacitor occupies a sizable surface area on the substrate, and therefore, not suitable for the use in a high integrated circuit. To achieve a high integration, a three dimensional structure of a capacitor, such as a stacked type or a trench type capacitor is adapted. However, as the integration becomes further higher, a pure three dimensional capacitor can not meet the requirement to be used. A method of increasing capacitance in a small area of a capacitor in a DRAM is developed.

Referring to FIG. 2a to FIG. 2d, a conventional method of fabricating a stack capacitor in a DRAM is shown. Referring to FIG. 2a, on a semiconductor substrate 200, a metal-oxide semiconductor (MOS) comprising a source/drain region 201, a gate 203, a field oxide layer 202, an oxide layer 204, and a poly-via 205 are formed. The poly-via 205 penetrates through the oxide layer 204 to electrically connects the source/drain region 201 of the MOS.

Referring to FIG. 2b, a poly-silicon layer 206 is formed on the oxide layer 204 and the poly-via 205, for example, by using chemical vapor deposition (CD). By aligning with the poly-via 205, an oxide layer 207 is formed and defined. On the oxide layer 207 and the poly-silicon layer 206, a poly-silicon layer 208 is formed.

Referring to FIG. 2c, using anisotropic etching, a part of the poly-silicon layer 206 and 208 are removed until the oxide layer 204 and 207 are exposed. The part of poly-silicon layer 206a covered by the oxide layer 207 is not removed with of the protection of the oxide layer 207. On a side wall of the oxide layer 207 and the poly-silicon layer 206a, a spacer 208a is formed of the remained poly-silicon layer 208.

Referring to FIG. 2d, using wet etching, for example, dip in hydrogen fluoride (HF) solution, the oxide layer 207 is removed. A bottom electrode formed by the combination of the poly-silicon layer 206a and 208a is formed. On the bottom electrode, a dielectric layer 209 and a top electrode 210 are formed in sequence to complete the formation a capacitor in a DRAM.

Referring to FIG. 3, a stacked type capacitor of a DRAM is shown. A semiconductor substrate 30 comprising a MOS transistor 32 which includes a gate 33, a source/drain region 34 and a spacer 35, a field oxide layer 36, and a conductive layer 37 is provided. An insulation layer 38 is formed and patterned over the substrate 30, so that a contact window is formed to expose the source/drain region 34. A bottom electrode 39, a dielectric layer 310, and a top electrode 311 is formed within and on the contact window in sequence to complete the stacked type capacitor 312. The dielectric layer 310 includes a nitride/oxide layer (ON) or an oxide/nitride/oxide (ONO) layer. The bottom electrode 39 and the top electrode 311 include poly-silicon layer. The bottom electrode 39 includes a ragged structure. After the process of forming metal contact and insulation passivation layers, the formation of a DRAM is completed.

In the conventional method of fabricating a capacitor of a DRAM, by improving the topography of a capacitor, for example, forming a ragged surface, the capacitance is increased. However, the increase of capacitance is not enough to meet the requirement of a further smaller devices.

SUMMARY OF THE INVENTION

It is therefore an object of the invention to provide a method of fabricating a dual cylindrical capacitor in a DRAM. With the topography of a concentric cylinder, the surface area of the capacitor is increased. Consequently, the capacitance is enhanced effectively to meet the requirement of a further small semiconductor device.

To achieve these objects and advantages, and in accordance with the purpose of the invention, as embodied and broadly described herein, the invention is directed towards a method of fabricating a dual cylindrical capacitor in a DRAM. A semiconductor substrate comprising a gate, a source/drain region, a field oxide layer, a first oxide layer covering the whole semiconductor substrate, and a poly-via penetrating through the first oxide layer to electrically connect the source/drain region is provided. A first poly-silicon layer is formed on the first oxide layer and the poly-via. A silicon nitride layer is formed and patterned on the first poly-silicon layer and aligned with the poly-via. An oxide spacer is formed on a side wall of the silicon nitride layer, so that a part of the first poly-silicon layer is covered by the oxide spacer. A part of the first poly-silicon layer is removed with the oxide spacer and the silicon nitride layer as a mask until the first oxide layer is exposed. The silicon nitride layer is removed. A poly-silicon spacer is formed around the oxide spacer. The oxide spacer is removed, so that the remaining first poly-silicon layer and the poly-silicon spacer are combined as a bottom electrode. A dielectric layer is formed on a surface of the electrode. A top electrode is formed on the dielectric layer.

It is to be understood that both the foregoing general description and the following detailed description are exemplary and explanatory only and are not restrictive of the invention, as claimed.

DESCRIPTION OF THE PREFERRED EMBODIMENTS

In FIG. 4a to FIG. 4f, a preferred embodiment of fabricating a cylindrical capacitor according to the invention is shown.

Figure 1:
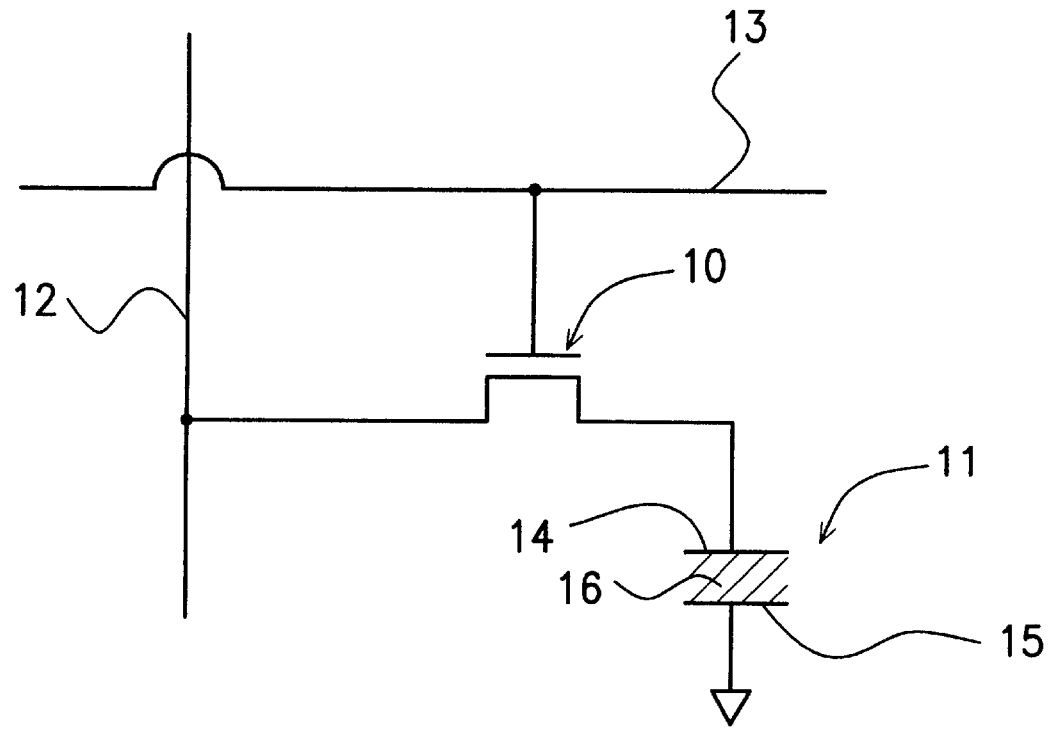
FIG. 1 shows a circuit diagram of a conventional DRAM.
Figure 3:
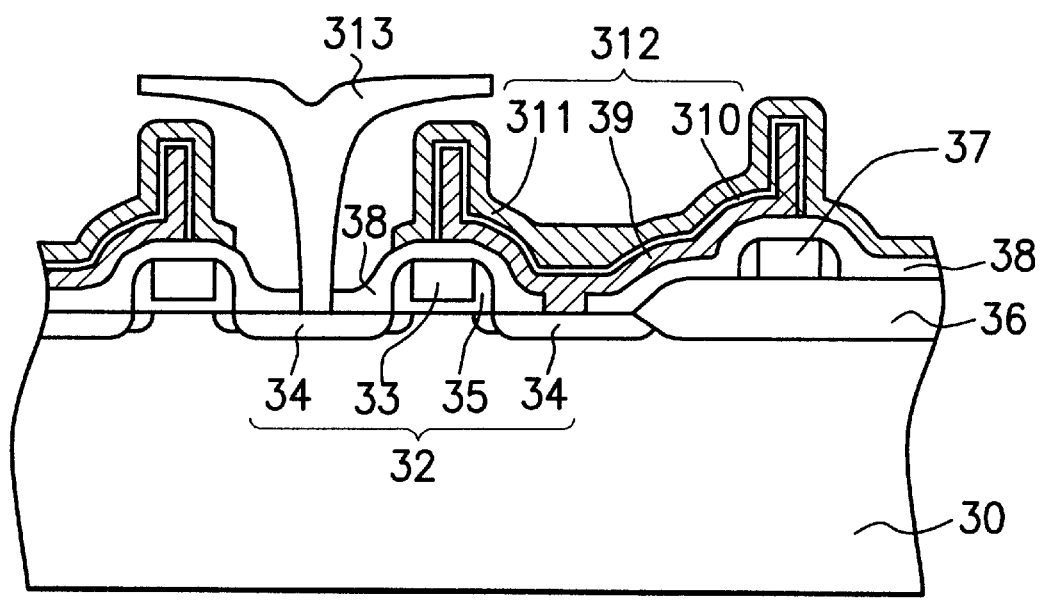
FIG. 3 is a cross sectional view of a conventional stacked type capacitor in a DRAM.
Figure 2A:
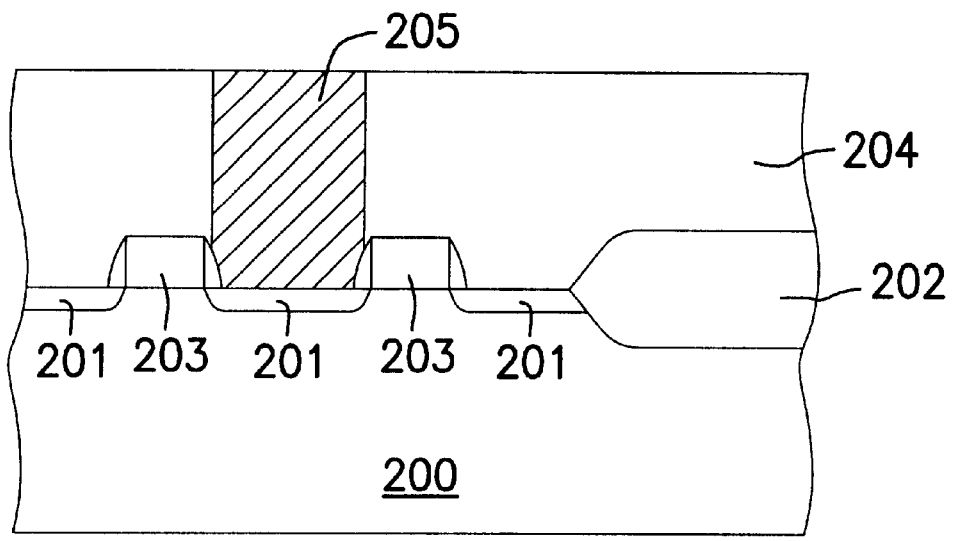
FIG. 2a to FIG. 2d show a conventional method of fabricating a cylindrical capacitor in a DRAM.
Figure 2B:
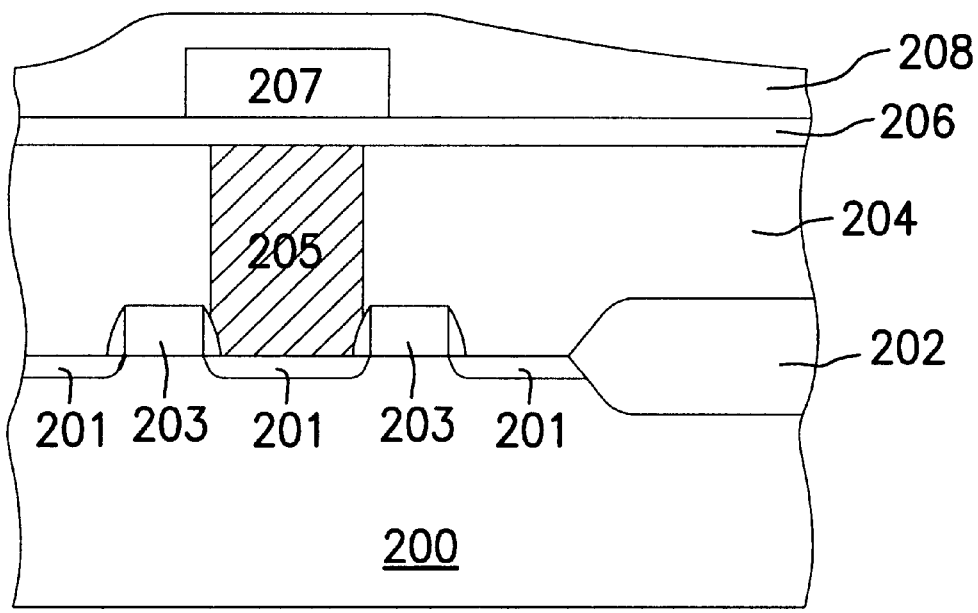
Figure 2C:
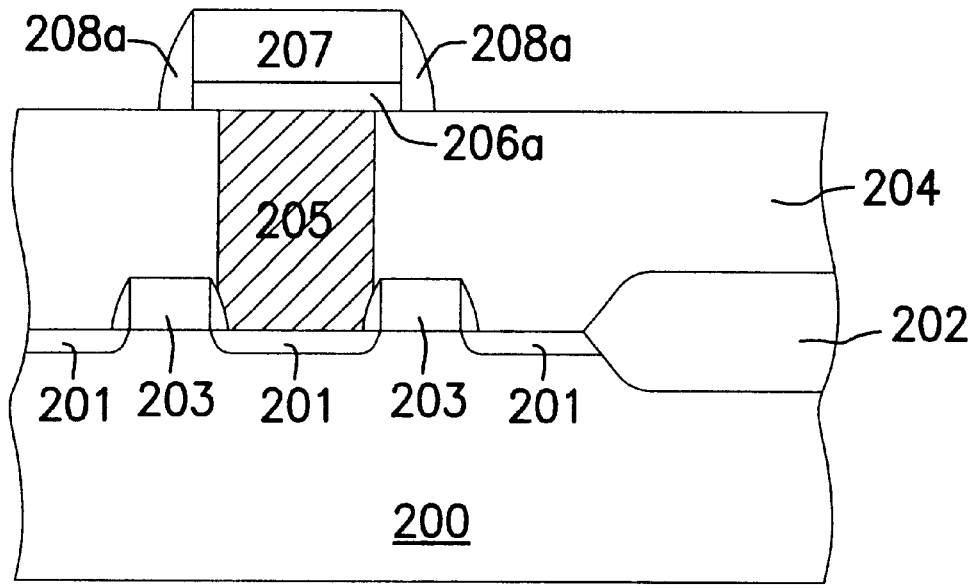
Figure 2D:
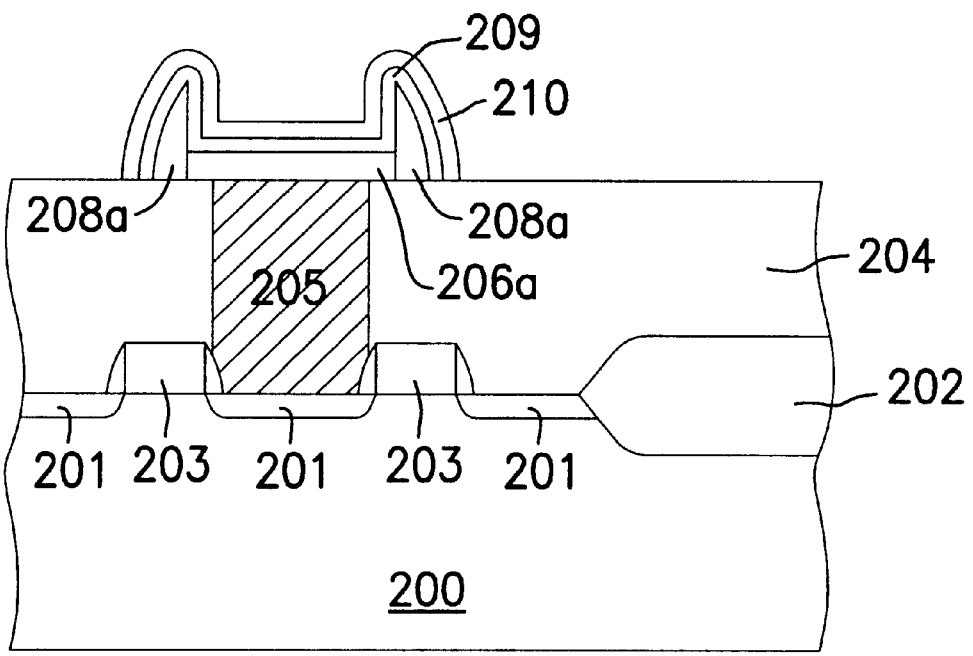
Figure 4A:
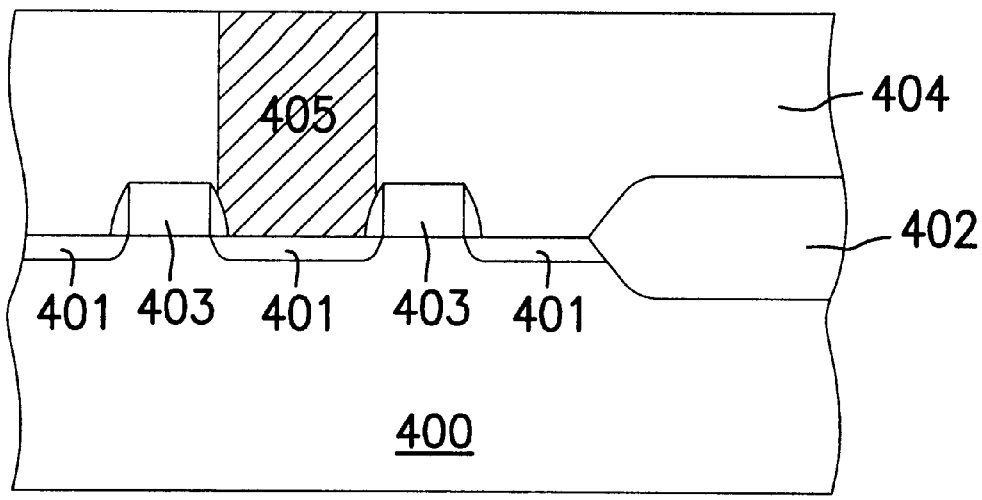
FIG. 4a to FIG. 4f show the cross sectional views of the process of fabricating a dual cylindrical capacitor in a DRAM in a preferred embodiment according to the invention.

Referring to FIG. 4a, a semiconductor substrate 400 is provided. The semiconductor substrate 400 comprises a MOS which includes a gate 403 and a source/drain region 401, a field oxide layer 402, a first oxide layer 404, and a poly-via 405. The poly-via penetrates through the first oxide layer 404 to electrically connect the source/drain region 401 of the MOS.

Figure 4B:
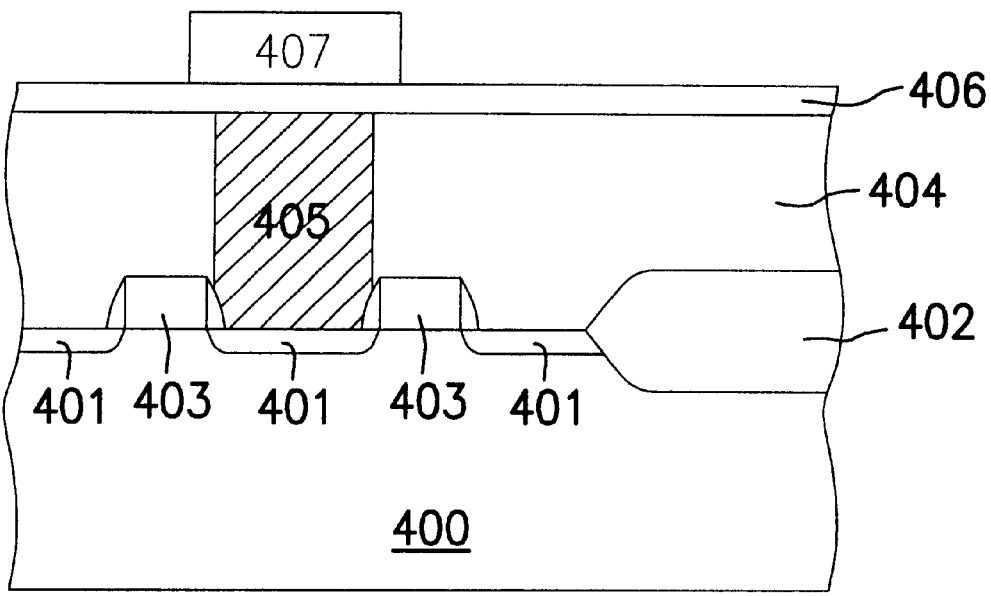

Referring FIG. 4b, on the first oxide layer 404 and the poly-via 405, a first poly-silicon layer 406 having a thickness of about 1 k Å to 2 k Å is formed, for example, chemical vapour deposition (CD). On the first poly-silicon layer 406, a silicon nitride layer 407 having a thickness of about 5 k Å is formed and defined to cover the whole poly-via 405 and a small part of the first oxide layer 404. It is to be noted th,at the thickness of the silicon nitride layer 407 directly affects the height of the cylindrical capacitor. The silicon nitride layer oxide layer 407 is to be removed completely in the subsequent process.

Figure 4C:
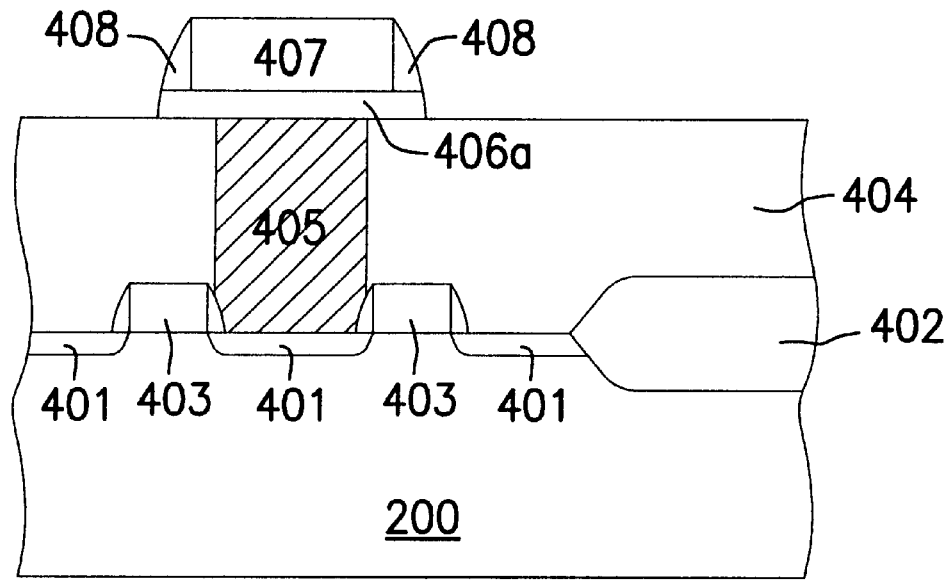

Referring to FIG. 4c, a second oxide layer (not shown) is formed on the silicon nitride layer 407 and the first poly-silicon layer 406. The second oxide layer is etched back to form an oxide spacer 408 on a side wall of the silicon nitride layer 407, so that a part of the first poly-silicon layer 406a is covered by the oxide spacer 408. Using etching, the first poly-silicon layer 406 uncovered by the silicon nitride layer 407 and the oxide spacer 408 is removed. The resultant structure is as shown in the figure.

Figure 4D:
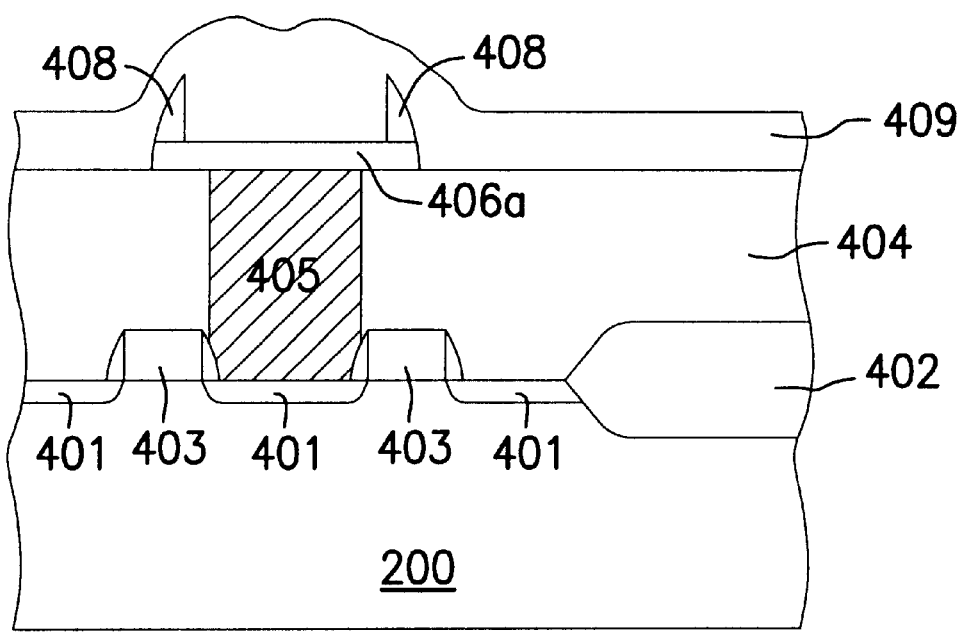

Referring to FIG. 4d, using wet etching, for example, by dip in phosphoric acid ($H_3PO_4$), the silicon nitride layer 407 is removed. Meanwhile, the surface part of the first poly-silicon layer 406 is to be removed. In the earlier step for forming the first poly-silicon layer 406, the loss of the poly-silicon layer while removing the silicon nitride to be taken into account. A second poly-silicon layer 409 is then formed over the semiconductor substrate 400, for example, by chemical vapour deposition.

Figure 4E:
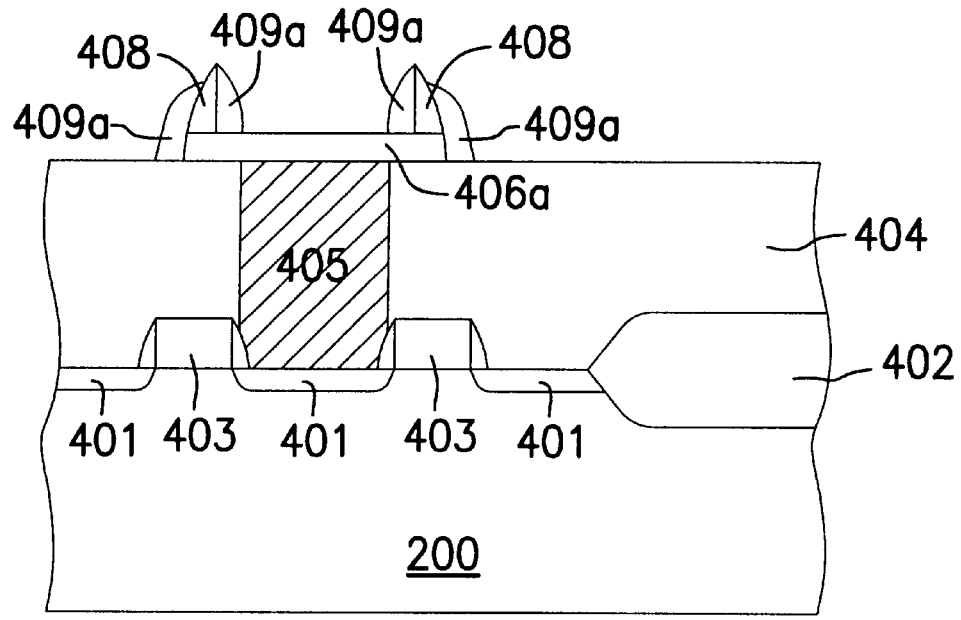

Referring to FIG. 4e, using the oxide spacer 408 and the silicon nitride layer 407 as a mask, the second poly-silicon layer 409 is etched back until the first oxide layer 404 is exposed, so that a poly-silicon spacer 409a is formed around the side walls of the oxide spacer 408.

Figure 4F:
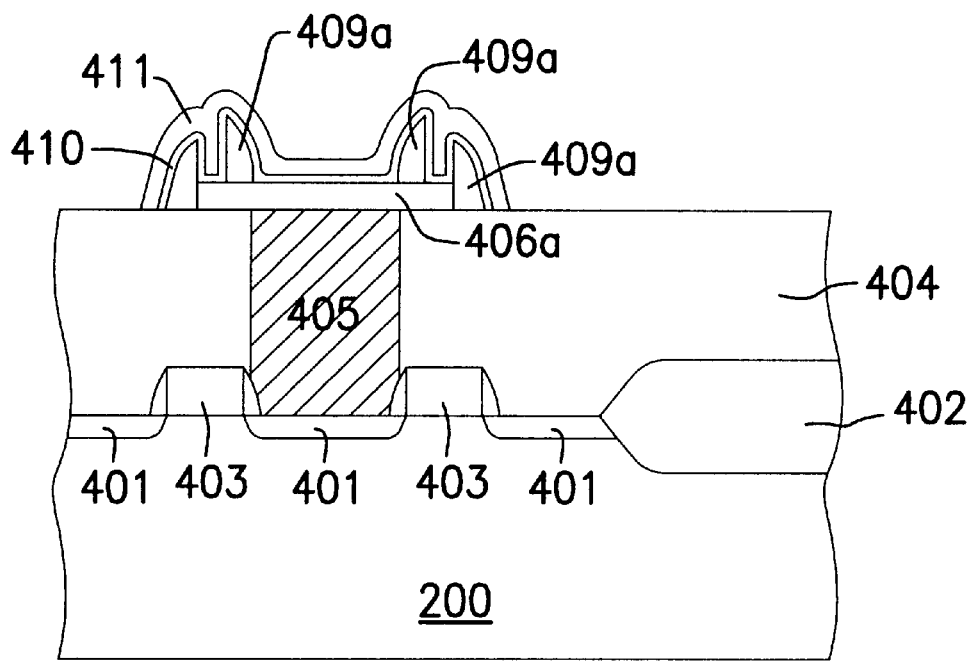

Referring to FIG. 4f, using wet etching, for example, by dip in hydrogen fluoride solution, the oxide spacer 408 is removed to form dual cylindrical bottom electrode of the combination of the remaining second poly-silicon layer 409a and the remaining first poly-silicon layer 406a. A dielectric layer 410, for example, an oxide/nitride/oxide (ONO) layer, and a top electrode 411 are formed on the surface of the bottom electrode sequentially.

It is therefore a characteristic of the invention to provide a method of fabricating a dual cylindrical capacitor in a DRAM. With the dual cylindrical structure, the surface area of a capacitor is enlarged, so that the capacitance is increased effectively.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating a dual cylindrical capacitor, wherein a semiconductor substrate comprising a gate, a source/drain region, a field oxide layer, a first oxide layer covering the whole semiconductor substrate, and a poly-via penetrating through the first oxide layer to electrically connect the source/drain region is provided, comprising:

forming a first poly-silicon layer on the first oxide layer and the poly-via;

forming and patterning a silicon nitride layer on the first poly-silicon layer and aligned with the poly-via, forming an oxide spacer on a side wall of the silicon nitride layer, so that a part of the first poly-silicon layer is covered by the oxide spacer;

removing a part of the first poly-silicon layer with the oxide spacer and the silicon nitride layer as a mask until the first oxide layer is exposed;

removing the silicon nitride layer;

forming a poly-silicon spacer around the oxide spacer;

removing the oxide spacer, so that the remaining first poly-silicon layer and the poly-silicon spacer are combined as a bottom electrode;

forming a dielectric layer on a surface of the electrode; and forming a top electrode on the dielectric layer.

2. The method according to claim 1, wherein the poly-via includes a metal plug.

3. The method according to claim 1, wherein the first poly-silicon layer has a thickness of about 1 k Å to 2 k Å.

4. The method according to claim 1, wherein the silicon nitride layer has a thickness larger than about 5 k Å.

5. The method according to claim 1, wherein the silicon nitride layer is removed by wet etching with phosphoric acid as an etchnat.

6. The method according to claim 1, wherein the oxide spacer is removed by wet etching with hydrogen fluoride solution as an etchant.

7. The method according to claim 1, wherein the poly-silicon spacer is formed by:

forming a second poly-silicon layer over the semiconductor substrate; and etching back the second poly-silicon layer, so that the poly-silicon spacer is formed of the remaining second poly-silicon layer.

8. The method according to claim 1, wherein the dielectric layer includes an oxide/nitride/oxide layer.

9. The method according to claim 1, wherein the top electrode includes a poly-silicon layer.

10. A method of fabricating a dual cylindrical capacitor, wherein a semiconductor substrate comprising a gate, a source/drain region, a field oxide layer, a first oxide layer covering the whole semiconductor substrate, and a poly-via penetrating through the first oxide layer to electrically connect the source/drain region is provided, comprising:

forming a first poly-silicon layer on the first oxide layer and the poly-via, the first poly-silicon layer having a thickness of about 1 k Å to 2 k Å;

forming and patterning a silicon nitride layer on the first poly-silicon layer and aligned with the poly-via, the silicon nitride layer having a thickness of about larger than 5 k Å;

forming an oxide spacer on a side wall of the silicon nitride layer, so that a part of the first poly-silicon layer is covered by the oxide spacer;

removing a part of the first poly-silicon layer with the oxide spacer and the silicon nitride layer as a mask until the first oxide layer is exposed;

removing the silicon nitride layer;

forming and etching back a second poly-silicon layer;

removing the oxide spacer, so that the remaining first poly-silicon layer and the poly-silicon spacer are combined as a bottom electrode;

forming a dielectric layer on a surface of the electrode; and forming a top electrode on the dielectric layer.

11. The method according to claim 10, wherein the poly-via includes a metal plug.

12. The method according to claim 10, wherein the silicon nitride layer is removed by wet etching with phosphoric acid as an etchnat.

13. The method according to claim 10, wherein the oxide spacer is removed by wet etching with hydrogen fluoride solution as an etchant.

14. The method according to claim 10, wherein the dielectric layer includes an oxide/nitride/oxide layer.

15. The method according to claim 10, wherein the top electrode includes a poly-silicon layer.

* * * * *